United States Patent
Sasaki

Patent Number: 5,290,394
Date of Patent: Mar. 1, 1994

[54] METHOD OF MANUFACTURING A THIN $Hg_{1-x}Cd_xTe$ FILM

[75] Inventor: Tokuhito Sasaki, Tokyo, Japan

[73] Assignee: NEC Corporation, Tokyo, Japan

[21] Appl. No.: 947,172

[22] Filed: Sep. 18, 1992

[30] Foreign Application Priority Data

Sep. 19, 1991 [JP] Japan ................... 3-238465

[51] Int. Cl.[5] ............ H01L 21/203; H01L 21/20
[52] U.S. Cl. ................ 156/613; 437/105; 437/107; 437/126; 437/133; 148/DIG. 64
[58] Field of Search .......... 148/DIG. 63, DIG. 64; 156/613; 437/126, 105, 107, 133

[56] References Cited

U.S. PATENT DOCUMENTS

4,960,728 10/1990 Schaake et al. ............ 437/105

FOREIGN PATENT DOCUMENTS

4-312915 11/1992 Japan ............ 437/107

OTHER PUBLICATIONS

Noreika et al. "Characterization of molecular beam epitaxially grown HgCdTe on CdTe and InSb buffer layers"x, J.Vac.Sci.Tech. A 4(4), Jul./Aug. 1986, pp. 2081-2085.

B. V. Shanabrook et al., "Large temperature changes induced by molecular beam epitaxial growth on radiatively heated substrates," *Appl. Phys. Lett.* 61(19), Nov. 9, 1992, pp. 2338-2340.

"Molecular-beam Epitaxy of $Cd_xHg_{1-x}Te$ at D.LETI/-LIR[a]", by A. Million et al., J. Vac. Sci. Technol. A 6(4). Jul./Aug. 1988, pp. 2813-2820.

Molecular Beam Epitaxy and Characterization of CdTe(211) and CdTe(133) films on GaAs(211)B Substrates, by M. D. Lange et al., Appl. Phys. Lett. 58(18), pp. 1988-1990, May 6, 1991.

HgCdTe on Si for Hybrid and Monolithic FPAs, by Ken Zanio, SPIE, vol. 1308, Infrared Detectors and Focal Plane Arrays, pp. 180-193, (1990).

Beven et al "Organometallic Vapor-Phase Epitaxy of $Hg_{1-x}Cd_xTe$ on (211)-oriented substrates" in J. Appl. Phys 71 (1992), pp. 204-210.

*Primary Examiner*—Olik Chaudhuri
*Assistant Examiner*—Ramamohan Rao Paladugu
*Attorney, Agent, or Firm*—Burns, Doane, Swecker & Mathis

[57] ABSTRACT

In a method of manufacturing a $Hg_{1-x}Cd_xTe$ (x=0 to 1) infrared detector using GaAs as a substrate, there is provided a method of depositing a HgCdTe film that has high crystalline quality. By changing the substrate temperature, it is possible to control the plane orientation of a CdTe buffer layer formed on a GaAs (211)B substrate. When the substrate temperature is high, the buffer layer is formed with plane orientation (133) and when the substrate temperature is low, the buffer layer is formed with plane orientation (211). In the former, it is possible to form a film having high crystalline quality as compared with that of a film in the latter.

15 Claims, 2 Drawing Sheets

METHOD OF MANUFACTURING A THIN $Hg_{1-x}Cd_xTe$ FILM

BACKGROUND OF THE INVENTION

1. Field of the Invention

This invention relates to a method of manufacturing $Hg_{1-x}Cd_xTe$ (also, hereinafter referred to as HgCdTe), and in more particular to a method of using a GaAs(211)B substrate and growing a CdTe buffer layer and a thin HgCdTe infrared detection layer on the substrate with high crystalline quality.

2. Description of the Prior Art

Formerly, when GaAs was used as a substrate material for a HgCdTe infrared detector, mainly the (100) plane and GaAs surfaces tilted slightly away from the (100) plane were used, and depending on the substrate heat treatment temperature and substrate heat treatment during exposure to a Te flux or Arsenic flux, a CdTe buffer layer was selected to be grown in the (100) or (111) orientation on the substrate, and a HgCdTe infrared detection layer was grown in either of these plane orientations on the substrates.

In the aforementioned method, during the high or elevated temperature heat treatment of the substrate, a problem exists in that the surface of the substrate becomes rough.

Also, it has been pointed out that if the thin HgCdTe film infrared detection layer was grown on the (100) oriented substrate, pyramid shaped protrusions were formed on the epilayer surface, and if the same layer was grown on the (111) oriented substrate, twinning occurred inside the crystal (refer to A. Million, L. DiCioccio, J. P. Gailliard and J. Piaguet, Journal of Vacuum Science and Technology A6 (4), Jul./Aug. (1988), 2813). These defects were a problem in that they lower the function of the HgCdTe infrared detection layer.

Furthermore, it has been reported that when a GaAs(211)B substrate was used as a substrate for a HgCdTe infrared detector, CdTe films were grown in both the (211) and (133) orientations on the GaAs(211)B substrates which were heat-treated at about 550° C. and at a temperature lower by about 15° C., respectively, while exposing the GaAs surfaces to a Te flux, and the CdTe growth temperatures were about 300° C. (M. D. Lange et al., Appl. Phys. Lett. 58(18), 6 May 1991, pp. 1988-1990). However, it was difficult to selectively grow the CdTe film in either of the (211) and (133) orientations on the GaAs(211)B substrates with high crystalline quality.

SUMMARY OF THE INVENTION

An object of this invention is to provide a method of manufacturing a thin $Hg_{1-x}Cd_xTe$ (x=0 to 1) film in which a CdTe buffer layer and a HgCdTe infrared detection layer are formed on a GaAs(211)B substrate with controlled plane orientations and improved crystalline quality.

The above object of this invention can be accomplished by providing a method of manufacturing a thin $Hg_{1-x}Cd_xTe$ (x=0 to 1) film on a GaAs(211)B substrate through a CdTe buffer layer, characterized in that the CdTe buffer layer is formed at a prescribed substrate temperature to control the plane orientation to be a prescribed orientation.

The prescribed substrate temperature is set within the range of not less than 200° C. and less than 290° C. to control the CdTe plane orientation to be a (211)B orientation and it is set within the range between 300° C. and 360° C. to control the CdTe plane orientation to be a (133) orientation, whereby crystalline quality can be improved.

The above subscript "x" is preferably within the range between about 0.17 and about 0.7.

DESCRIPTION OF THE PREFERRED EMBODIMENTS

Figure 1:
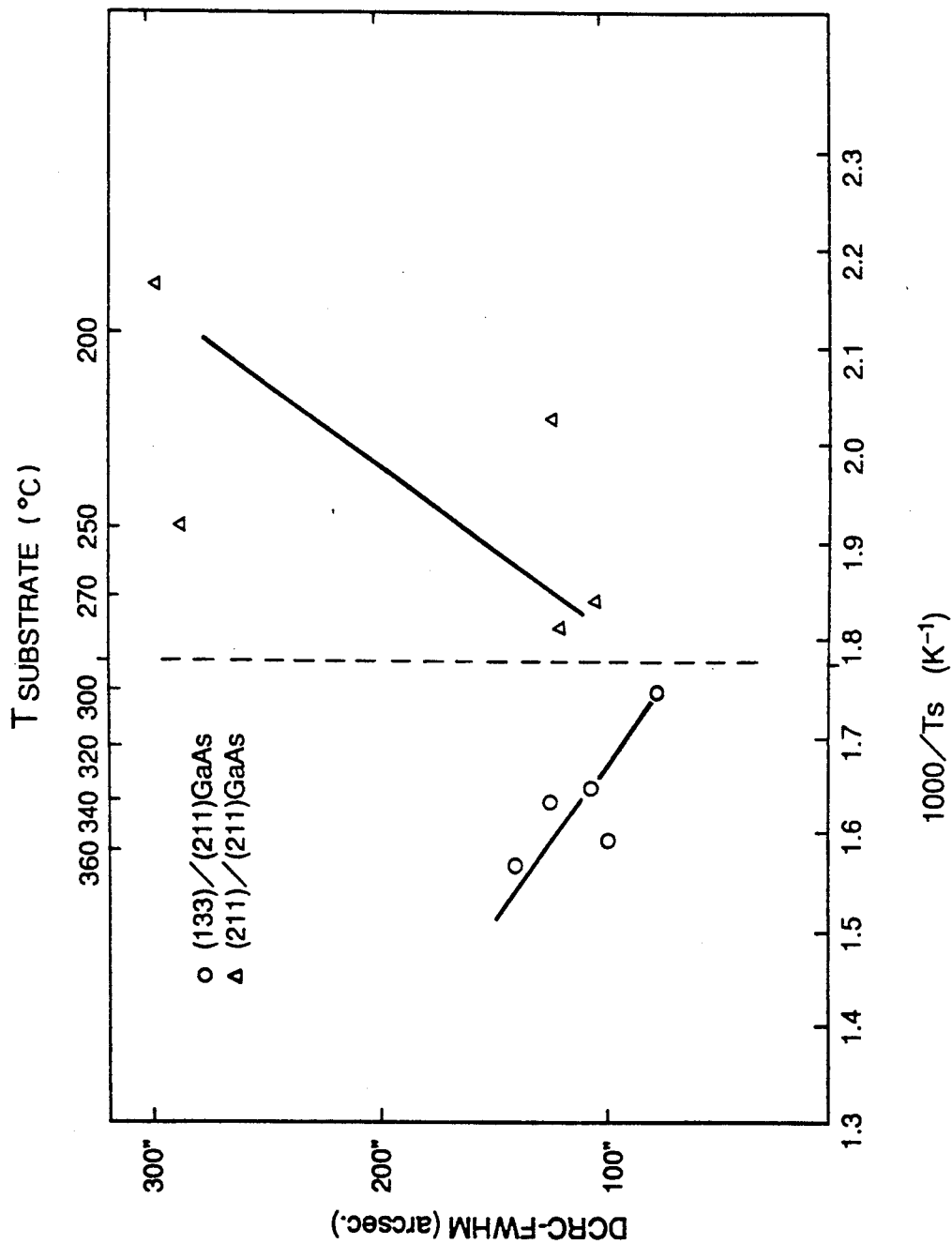
FIG. 1 is a diagram showing how the orientation of a growth surface can be controlled by a substrate temperature.

According to one embodiment of this invention, there is provided a method of manufacturing an infrared detector material on a GaAs(211)B substrate through a CdTe buffer layer, in which the surface of the substrate is exposed to a Te flux and heat treatment is performed at a lower temperature when compared to a (100) GaAs substrate, making it possible to prevent surface roughness which occurs due to the heat treatment.

If the CdTe buffer layer is formed on the treated GaAs(211)B substrate, it is possible to control the plane orientation for growth using the specified substrate temperature. If the CdTe buffer layer is grown in a (211)B or (133) plane orientation, it is possible to improve the crystalline quality of the buffer layer.

Also, in a method of manufacturing deposited or grown layers of $Hg_{1-x}Cd_xTe$ (x=0 to 1) on the GaAs(211)B substrate through the CdTe buffer layer, it is possible to control the plane orientations to be the (211)B and (133) orientations by growing the CdTe buffer layers at a substrate temperature of not less than 200° C. and less than 290° C. and at the temperature between 300° C. and 360° C., respectively. In this invention, the subscript "x" of $Hg_{1-x}Cd_xTe$ is selected to detect an intended infrared wavelengh range.

Furthermore, according to this invention, in depositing layers of crystals of HgCdTe on the GaAs(211)B substrate through the CdTe buffer layer, the CdTe buffer layer is grown in the (211)B or (133) plane orientation, whereby it is possible to deposit layers of good quality crystals to form a HgCdTe infrared detector with the same orientation.

Below, the method of manufacturing the infrared detector material according to this embodiment of the invention will be explained in more detail.

If the HgCdTe film is formed using a molecular-beam epitaxy (MBE) device, it is possible to monitor the condition of the crystal surface using high speed electron diffraction. In so doing, if the GaAs(211)B substrate is used, it has been confirmed that an oxidation layer can be desorbed at 550° C. which is approximately 30° C. lower than for the GaAs(100) substrate. When the GaAs(211)B substrate is used and its surface is exposed to the Te flux in order to prevent surface roughness of the substrate, a good quality growth surface for the CdTe buffer layer and the HgCdTe infrared detection layer could be obtained.

When the substrate temperature was kept in the range of not less than 200° C. and less than 290° C., such as 220° C., 250° C., 270° C. and 280° C., and preferably in the range between 270° C. and 290° C., it was possible to control the growth of the CdTe buffer layer on the above treated surface to the (211) plane orientation with high crystalline quality. The above preferable range is selected to keep reproducibility with respect of the (211) plane orientation and high crystalline quality. In the same way, if the substrate temperature was kept in the range between 300° C. and 360° C., such as 300° C., 335° C., 340° C. and 355° C., and preferably in the range between 310° C. and 330° C., it was possible to control the growth of the CdTe buffer layer thereon to the (133) plane orientation with high crystalline quality. However, as the CdTe buffer layer is grown at higher temperature, the defect such as numerous fine projections appears on the crystal surface. Therefore, the above preferable range is selected to keep reproducibility with respect of the (133) plane orientation and high crystalline quality. If the substrate temperature was kept in the range of 290° C. to 300° C., it is quite hard to reproduce the same plane orientation as before. This can be seen from Table 1 and FIG. 1 in which data of Table 1 is plotted.

TABLE 1

| $T_{substrate}$ (°C.) | DCRC-FWHM (arcsec.) | Growth orientation |
| --- | --- | --- |
| 190 | 300 | (211) |
| 220 | 127 | (211) |
| 250 | 287 | (211) |
| 270 | 107 | (211) |
| 280 | 121 | (211) |
| 300 | 78 | (133) |
| 335 | 108 | (133) |
| 340 | 126 | (133) |
| 355 | 98 | (133) |
| 365 | 142 | (133) |

In FIG. 1, the ordinate axis of the diagram shows the evaluated crystalline quality based on X-ray double-crystal rocking curves (DCRCs) and the transverse axis shows the substrate temperature. From the diagram, it can be seen that according to the substrate temperature, it was possible to control the plane orientation for growth to be either the (211) or (133) orientation. If the substrate temperature was kept in the preferable range mentioned above to grow the CdTe buffer layer, the growth of the CdTe buffer layer on the substrate could be more satisfactorily or selectively controlled to the desired plane orientations. When the substrate temperature was kept out of the above ranges, i.e. at 190° C. and 365° C., the crystalline quality of thus obtained CdTe was low as compared with that of CdTe grown according to this invention and thus was not efficient in the art.

Figure 2:
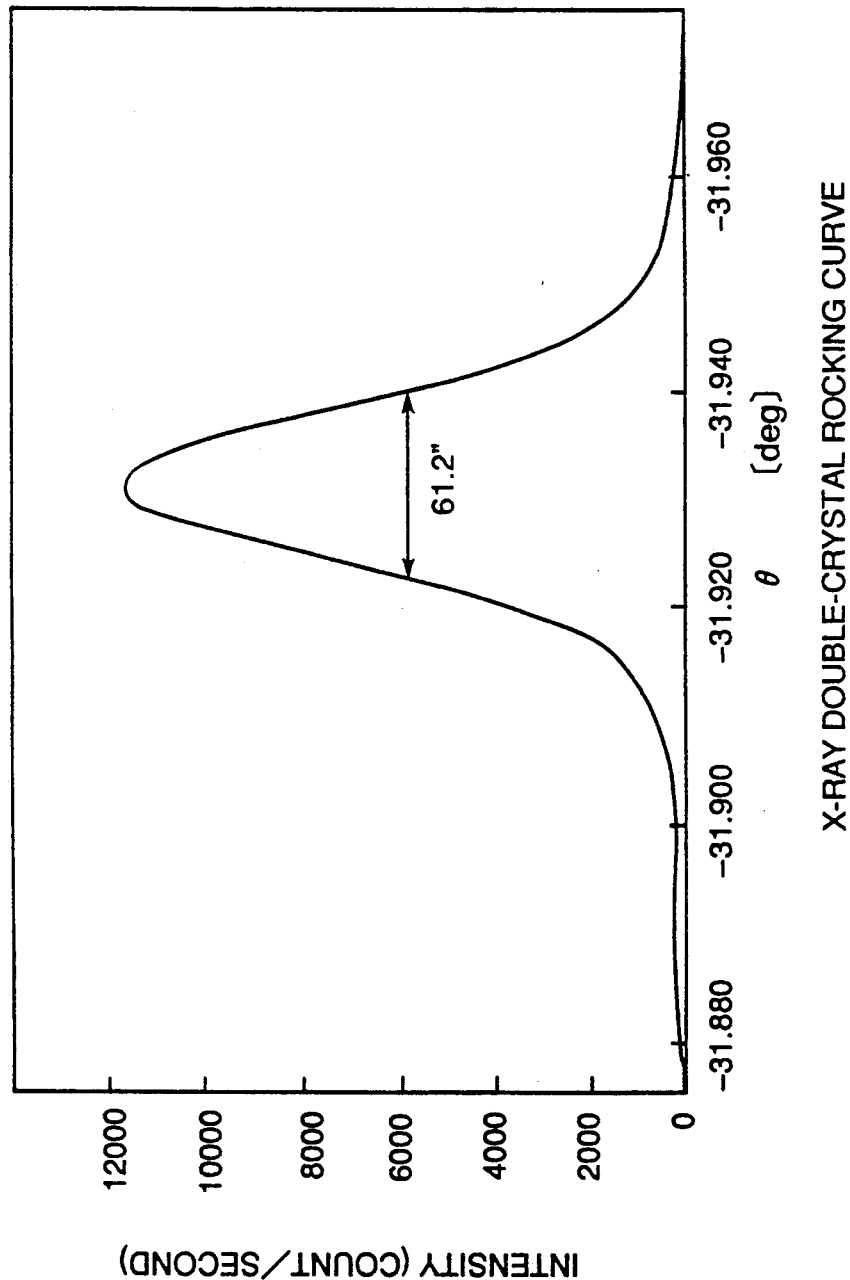
FIG. 2 is a diagram explaining the high crystalline quality of a (133) plane orientation.

FIG. 2 shows the evaluation result on CdTe using X-ray double-crystal rocking curve when the CdTe was grown in the (133) orientation on the GaAs(211)B substrate at 330° C. From the diagram, it can be seen that CdTe having high crystalline quality with a full width at half maximum (FWHM) of approximately 60 sec. was obtained. This type of result could not be obtained for the prior GaAs(100) oriented substrate or for the prior GaAs substrate slightly tilted with respect to the substrate (refer to K. Zanio, SPIE, Vol. 1308, "Infrared Detectors and Focal Plane Arrays", (1990) 184). Ordinarily, the crystalline quality of the buffer layer determines the quality of the crystal film formed on top of it. As described above, it was possible to form the CdTe buffer layer having high crystalline quality for specific growth orientations. Thus, when HgCdTe was grown on this good quality buffer layer as a base at a substrate temperature of about 180° to about 200° C., it was possible to form a HgCdTe layer having high crystalline quality. In this way it was possible to form a high quality HgCdTe layer and it can be expected that the operation characteristics of this layer be good.

According to this embodiment of the invention described above for a method of manufacturing an infrared detector, it is possible to form a CdTe buffer layer and a thin HgCdTe film infrared detection layer which have high crystalline quality, and it is possible to obtain a HgCdTe infrared detector that has good operability.

What is claimed is:

1. A method of manufacturing a thin $Hg_{1-x}Cd_xTe$ (x=0 to 1) film on a GaAs(211)B substrate through a CdTe buffer layer by molecular beam epitaxy, which comprises the steps of:

heat treating said GaAs(211)B substrate at approximately 550° C. while exposing the surface thereof to a Te flux; and forming said CdTe buffer layer at a prescribed substrate temperature to control the plane orientation to result in a prescribed orientation.

2. The method of manufacturing a thin $Hg_{1-x}Cd_xTe$ (x=0 to 1) film as defined in claim 1, wherein said CdTe buffer layer is formed at a substrate temperature of not less than 200° C. and less than 290° C. to control the surface orientation to be a (211)B orientation.

3. The method of manufacturing a thin $Hg_{1-x}Cd_xTe$ (x=0 to 1) film as defined in claim 2, wherein said substrate temperature is between 270° C. and 290° C.

4. The method of manufacturing a thin $Hg_{1-x}Cd_xTe$ (x=0 to 1) film as defined in claim 2, wherein said $Hg_{1-x}Cd_xTe$ film is formed on said CdTe buffer layer at a substrate temperature of 180° C. to 200° C.

5. The method of manufacturing a thin $Hg_{1-x}Cd_xTe$ (x=0 to 1) film as defined in claim 1, wherein said CdTe buffer layer is formed at a substrate temperature between 300° C. and 360° C. to control the surface orientation to be a (133) orientation.

6. The method of manufacturing a thin $Hg_{1-x}Cd_xTe$ (x=0 to 1) film as defined in claim 5, wherein said substrate temperature is between 310° C. and 330° C.

7. The method of manufacturing a thin $Hg_{1-x}Cd_xTe$ (x=0 to 1) film as defined in claim 5, wherein said $Hg_{1-x}Cd_xTe$ film is formed on said CdTe buffer layer at a substrate temperature of 180° C. to 200° C.

8. The method of manufacturing a thin $Hg_{1-x}Cd_xTe$ (x=0 to 1) film as defined in claim 5, wherein said CdTe buffer layer having the (133) orientation comprises CdTe having crystalline quality of a full width at half maximum of approximately 60 sec.

9. A method of manufacturing a thin $Hg_{1-x}Cd_xTe$ (x=0 to 1) film on a GaAs(211)B substrate through a CdTe buffer layer by molecular beam epitaxy, which comprises the steps of: heat treating said GaAs(211)B substrate at approximately 550° C. while exposing the surface thereof to a Te flux, forming said CdTe buffer layer on the treated substrate surface at a substrate temperature of not less than 200° C. and less than 290° C., and then forming said $Hg_{1-x}Cd_xTe$ film on the CdTe buffer layer having a resulting (211)B growth orientation.

10. The method of manufacturing a thin $Hg_{1-x}Cd_xTe$ (x=0 to 1) film as defined in claim 9, wherein said substrate temperature is between 270° C. and 290° C.

11. The method of manufacturing a thin $Hg_{1-x}Cd_xTe$ (x=0 to 1) film as defined in claim 9, wherein said $Hg_{1-x}Cd_xTe$ film is formed on said CdTe buffer layer at a substrate temperature of 180° C. to 200° C.

12. A method of manufacturing a thin $Hg_{1-x}Cd_xTe$ (x=0 to 1) film on a GaAs(211)B substrate through a CdTe buffer layer by molecular beam epitaxy, which comprises the steps of: heat-treating said GaAs(211)B substrate at approximately 550° C. while exposing the surface thereof to a Te flux, forming said CdTe buffer layer on the treated substrate surface at a substrate temperature between 300° C. and 360° C., and then forming said $Hg_{1-x}Cd_xTe$ film on the CdTe buffer layer having a resulting (133) growth orientation.

13. The method of manufacturing a thin $Hg_{1-x}Cd_xTe$ (x=0 to 1) film as defined in claim 12, wherein said substrate temperature is between 310° C. and 330° C.

14. The method of manufacturing a thin $Hg_{1-x}Cd_xTe$ (x=0 to 1) film as defined in claim 12, wherein said $Hg_{1-x}Cd_xTe$ film is formed on said CdTe buffer layer at a substrate temperature of 180° C. to 200° C.

15. The method of manufacturing a thin $Hg_{1-x}Cd_xTe$ (x=0 to 1) film as defined in claim 12, wherein said CdTe buffer layer having the (133) growth orientation comprises CdTe having crystalline quality of a full width at half maximum of approximately 60 sec.

* * * * *